United States Patent
Flateau, Jr. et al.

(10) Patent No.: US 8,683,166 B1
(45) Date of Patent: Mar. 25, 2014

(54) MEMORY CONTROLLER WITH SUSPEND FEATURE

(75) Inventors: Roger D. Flateau, Jr., Albuquerque, NM (US); Wayne E. Wennekamp, Rio Rancho, NM (US); Thomas H. Strader, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1061 days.

(21) Appl. No.: 12/692,771

(22) Filed: Jan. 25, 2010

Related U.S. Application Data

(60) Provisional application No. 61/148,926, filed on Jan. 31, 2009, provisional application No. 61/148,927, filed on Jan. 31, 2009.

(51) Int. Cl.
*G06F 12/00* (2006.01)

(52) U.S. Cl.
USPC ............... 711/167; 711/154; 711/E12.069

(58) Field of Classification Search
USPC .......................................................... 711/167
See application file for complete search history.

(56) References Cited

PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No 12/693,397, filed Jan. 25, 2010, Wennekamp, et al., Xilinx, Inc., 2100 Logic Drive, San Jose, CA.
U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.
U.S. Appl. No. 12/694,656, filed Jan. 27, 2010, Elkins, et al., Xilinx, Inc., 2100 Logic Drive, San Jose, CA.
Xilinx, Inc., Spartan-6 FPGA Configuration, User Guide, UG380, v1.0, Jun. 24, 2009, Chapter 4, User Primitives, p. 64, 2100 Logic Drive, San Jose, CA US.
Xilinx, Inc., Spartan-6 FPGA Configuration, User Guide, UG380, v2.0, Feb. 17, 2010, Chapter 4, User Primitives, p. 64, 2100 Logic Drive, San Jose, CA US.

(Continued)

*Primary Examiner* — Reginald Bragdon
*Assistant Examiner* — Hamdy S Ahmed
(74) *Attorney, Agent, or Firm* — Kevin T. Cuenot

(57) ABSTRACT

A programmable integrated circuit device (IC) can include a configuration controller configured to assert a suspend request signal responsive to an input triggering suspend mode within the programmable IC and a memory controller block coupled to the configuration controller and a memory device. The memory controller block can be configured to place the memory device in self refresh mode in response to the suspend request signal and assert a suspend acknowledgement signal subsequent to placing the memory device in self refresh mode. The configuration controller can continue implementing suspend mode within the programmable IC in response to assertion of the suspend acknowledgement signal.

20 Claims, 6 Drawing Sheets

(56) References Cited

PUBLICATIONS

Xilinx, Inc., Spartan-6 FPGA Configuration, User Guide, UG380, v2.3, Jul. 6, 2011, Chapter 4, User Primitives, p. 64, 2100 Logic Drive, San Jose, CA US.

Xilinx, Inc., Spartan-6 FPGA Memory Controller, User Guide, UG388, v1.0, May 28, 2009, Chapter 3-6, pp. 59-114, 2100 Logic Drive, San Jose, CA US.

Xilinx, Inc., Spartan-6 FPGA Memory Controller, User Guide, UG388, v1.1, Aug. 18, 2009, Chapter 3-6, pp. 59-114, 2100 Logic Drive, San Jose, CA US.

Xilinx, Inc., Spartan-6 FPGA Memory Controller, User Guide, UG388, v2.2, Jun. 14, 2010, Chapter 3-6, pp. 59-114, 2100 Logic Drive, San Jose, CA US.

Xilinx, Inc., Spartan-6 FPGA Memory Controller, User Guide, UG388, v2.0.1, Jan. 5, 2010, pp. 1-62, 2100 Logic Drive, San Jose, CA US.

Xilinx, Inc., Spartan-6 FPGA Memory Controller, User Guide, UG388, v2.1, Mar. 4, 2010, pp. 1-64, 2100 Logic Drive, San Jose, CA US.

Xilinx, Inc., Spartan-6 FPGA Memory Controller, User Guide, UG388, v2.3, Aug. 9, 2010, pp. 1-66, 2100 Logic Drive, San Jose, CA US.

MEMORY CONTROLLER WITH SUSPEND FEATURE

CROSS-REFERENCE TO RELATED APPLICATIONS

This application claims benefit of U.S. Provisional Patent Application having the Application No. 61/148,926 filed on Jan. 31, 2009 and entitled "Apparatus and Method for a Memory Controller"; and also U.S. Provisional Patent Application having the Application No. 61/148,927 filed on Jan. 31, 2009 and entitled "Architecture for Advanced Integrated Circuit Providing Good Performance and Low Cost." Both of these provisional patent applications are incorporated herein by reference in their entirety.

FIELD OF THE INVENTION

One or more embodiments disclosed within this specification relate to integrated circuit devices (ICs). More particularly, one or more embodiments relate to suspending operation of a memory controller without loss of data within a memory device coupled to the memory controller.

BACKGROUND

Programmable integrated circuit devices (ICs) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Some programmable ICs include a memory controller that interfaces with an external, or "off chip," memory device. When the programmable IC is placed into a low power mode, often referred to as a suspend mode, various subsystems within the programmable IC required by the memory controller to function properly are shut down. Accordingly, implementation of suspend mode, due to the shut down of the subsystems, can result in data loss within the external memory device.

SUMMARY

One or more embodiments disclosed within this specification relate to integrated circuit devices (ICs) and, more particularly, to suspending operation of a memory controller without loss of data within a memory device coupled to the memory controller.

One embodiment of the present invention can include a programmable IC including a configuration controller configured to assert a suspend request signal responsive to an input triggering suspend mode within the programmable IC and a memory controller block coupled to the configuration controller and a memory device. The memory controller block can be configured to place the memory device in self refresh mode in response to the suspend request signal and assert a suspend acknowledgement signal subsequent to placing the memory device in self refresh mode. The configuration controller can continue implementing suspend mode within the programmable IC responsive to assertion of the suspend acknowledgement signal.

Another embodiment of the present invention can include a memory controller block disposed within a programmable IC. The memory controller block can be coupled to a memory device external to the programmable IC. Accordingly, the memory controller block can include an arbitration circuit configured to fetch commands received by the memory controller block to be executed. Responsive to a suspend request signal indicating that the programmable IC is to be placed into suspend mode, the arbitration circuit can be configured to stop fetching commands and generate a self refresh act signal. The memory controller block further can include a controller core coupled to the arbitration circuit configured to execute commands fetched by the arbitration circuit. The controller core, responsive to the self refresh act signal, can be configured to issue a self refresh enter command to the memory device.

Another embodiment of the present invention can include a method of placing a programmable IC in suspend mode implemented within a programmable IC comprising a memory controller block coupled to a memory device external to the programmable IC. The method can include, responsive to an input triggering a suspend mode within the programmable IC, sending a suspend request signal to the memory controller and, responsive to the suspend request signal, the memory controller placing the memory device in a self refresh mode. A suspend acknowledgement signal can be generated responsive to placing the memory device in the self refresh mode. The programmable IC can be placed in suspend mode responsive to the suspend acknowledgement signal.

DETAILED DESCRIPTION OF THE DRAWINGS

While the specification concludes with claims defining the features of one or more embodiments of the invention that are regarded as novel, it is believed that one or more embodiments of the invention will be better understood from a consideration of the description in conjunction with the drawings. As required, one or more detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the one or more embodiments of the invention.

One or more embodiments disclosed within this specification relate to integrated circuit devices (ICs). More particularly, one or more embodiments relate to suspending operation of a programmable IC comprising a memory controller without loss of data within a memory device coupled to the memory controller. In accordance with one or more embodiments disclosed herein, a suspend mode can be initiated within the programmable IC. Prior to shutting down various subsystems of the programmable IC that could result in data loss within the memory device coupled to the memory controller, the memory controller can initiate a self refresh mode within the memory device. The memory device can remain in self refresh mode until the programmable IC exits suspend mode, thereby preserving any data stored within the memory device for the duration of the suspend mode.

Figure 1:
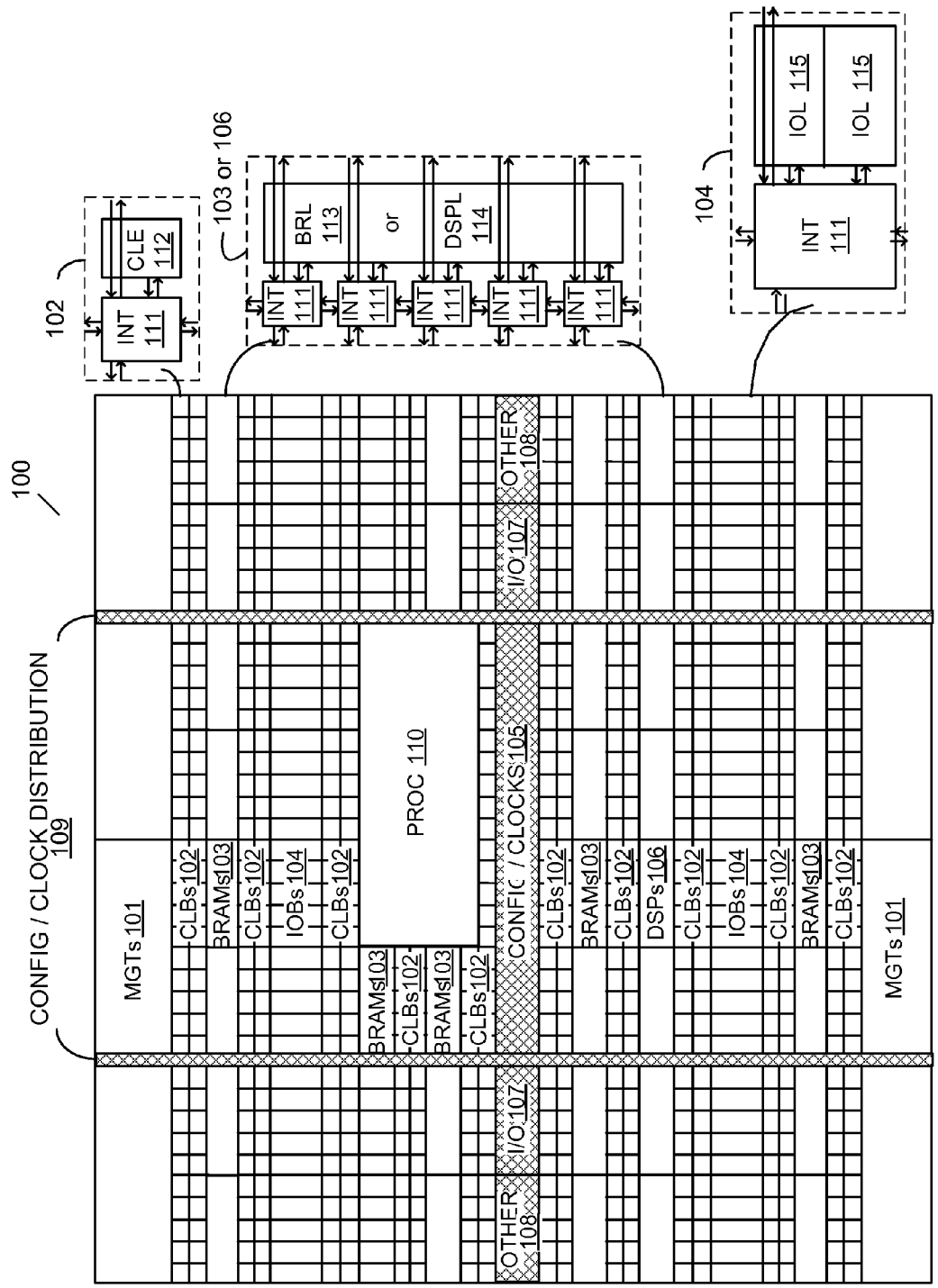
FIG. 1 is a first block diagram illustrating a Field Programmable Gate Array (FPGA) architecture that includes several different types of programmable logic blocks in accordance with one embodiment of the present invention.

FIG. 1 is a first block diagram illustrating a Field Programmable Gate Array (FPGA) architecture that includes several different types of programmable logic blocks in accordance with one embodiment of the present invention. Advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking circuitry (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements, taken together, implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads coupled, for example, to the I/O logic element 115 typically are not confined to the area of the input/output logic element 115.

In the pictured embodiment, a horizontal area near the center of the die (shown shaded in FIG. 1) is used for configuration, clock, and other control logic. Vertical areas 109 extending from this horizontal area are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
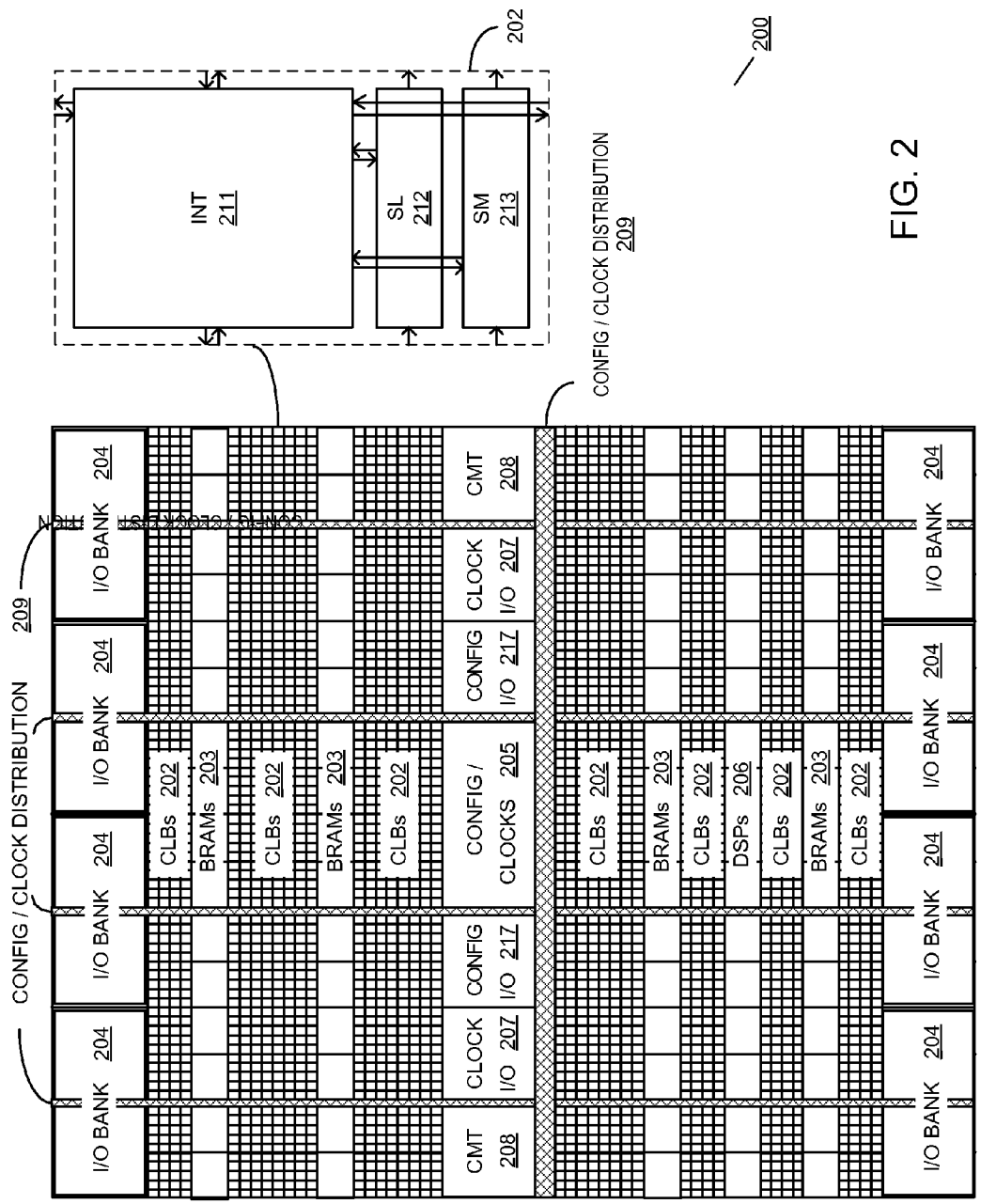
FIG. 2 is a second block diagram illustrating another FPGA architecture that uses the same general architecture as the FPGA of FIG. 1, and that includes several different types of programmable logic blocks in accordance with another embodiment of the present invention.

FIG. 2 is a second block diagram illustrating another FPGA architecture that uses the same general architecture as the FPGA of FIG. 1, and that includes several different types of programmable logic blocks in accordance with another embodiment of the present invention. The FPGA 200 of FIG. 2 includes CLBs 202, BRAMs 203, I/O blocks divided into "I/O Banks" 204 (each including 40 I/O pads and the accompanying logic), configuration and clocking circuitry 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices," slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

FIGS. 1 and 2 illustrate FPGA type programmable ICs by way of example to better illustrate the various embodiments of the present invention. It should be appreciated, however, that the embodiments disclosed herein can be applied to other types of programmable ICs and that FPGAs are used for purposes of illustration without limitation.

Figure 3:
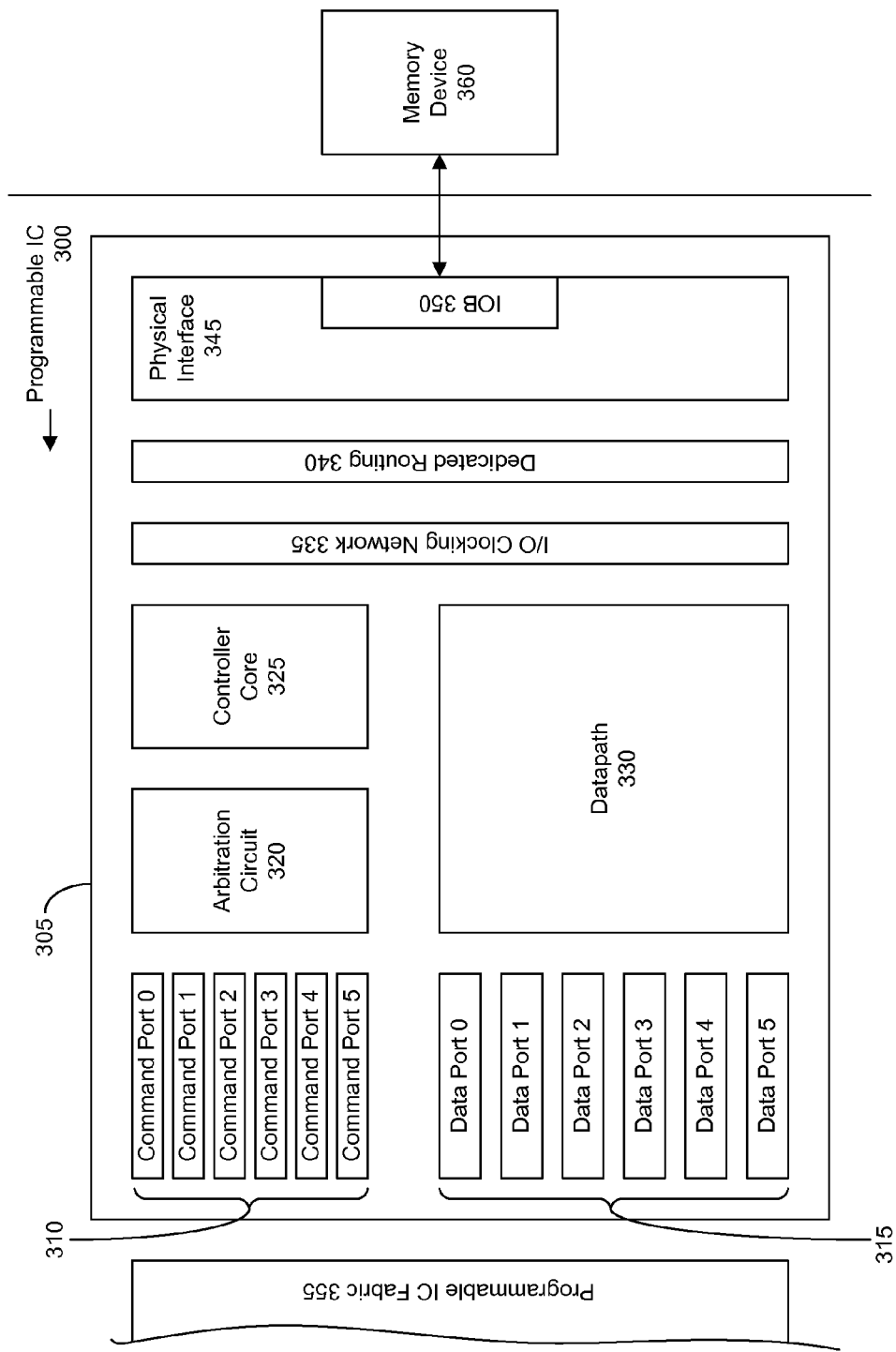
FIG. 3 is a third block diagram illustrating a memory controller block disposed within a programmable IC in accordance with another embodiment of the present invention.

FIG. 3 is a third block diagram illustrating a memory controller block 305 disposed within a programmable IC 300 in accordance with another embodiment of the present invention. Memory controller block 305 can be disposed within any of a variety of programmable ICs. For example, memory controller block 305 can be disposed within an FPGA having the architecture illustrated with respect to FIG. 1 or an FPGA having an architecture illustrated with respect to FIG. 2. The particular type of programmable IC within which memory controller block 305 is disposed is not intended to limit the embodiments disclosed herein, so long as the programmable IC can implement a suspend, or low power, mode wherein one or more components or subsystems, including memory controller block 305, can be placed in a low power mode or powered off as generally described within this specification.

As pictured, memory controller block 305 includes a plurality of command ports 310, a plurality of data ports 315, an arbitration circuit 320, and a controller core 325. Memory controller block 305 further can include a datapath 330, I/O clocking network 335, dedicated routing 340, and a physical interface 345 comprising at least one IOB 350.

Command ports 310 can be coupled to programmable IC fabric 355 to receive commands directed to memory controller 305 relating to accessing memory device 360. Programmable IC fabric 355 represents the portion of programmable IC 300 that can be programmed, or otherwise configured, to implement user circuit designs or portions of user circuit designs. Data ports 315 also can be coupled to programmable IC fabric 355 to output data read from memory device 360 and to receive data to be written to memory device 360.

Arbitration circuit 320 can be configured to determine which one of command ports 310 currently has priority for accessing memory device 360. Arbitration circuit 320 obtains a command from the command port having priority and provides the command to controller core 325. Controller core 325 can convert commands received through command ports 310, e.g., the user interface, into the instructions and signal sequences necessary to communicate with memory device 360. As noted, memory device 360 is external to programmable IC 300, e.g., is "off-chip."

Datapath 330 comprises the circuitry necessary to process, or handle, the flow of data between memory device 360 and programmable IC fabric 355. Physical interface 345 can be configured to convert instructions into the actual timing relationships and signaling necessary to communicate with memory device 360. Memory controller block 305 can utilize the general I/O clocking network 335, as described with reference to FIGS. 1 and 2, to facilitate operation and communication with memory device 360. The I/O clocking network 335, which is similar to the global clocking network of programmable IC 300, can operate at higher frequencies than the global clocking network. The I/O clocking network 335 can be used to clock I/Os of programmable IC 300 and memory controller block 305. Signals exchanged between physical interface 345 and core controller 325 and physical interface 345 and datapath 330 can be processed through dedicated routing 340 comprising dedicated wiring circuitry unavailable for use by user circuit designs, thereby facilitating efficient data exchange. The external interface between memory device 360 and physical interface 345 can be implemented using IOB(s) 350, as described with reference to FIGS. 1 and 2.

Memory device 360 can be implemented as any of a variety of memory devices. For example, memory device 360 can be implemented in the form of a single data rate (SDR) type of device, a standard double data rate (DDR) type of device comprising a standard memory interface, a DDR2 type of device, a DDR3 type of device, or a low power DDR (LPDDR or mobile DDR) type of device. Though not shown, memory device 360 can include a memory control input configured to receive memory control signals, a data interface configured to receive data and output data, and an address input configured to receive a memory address that is the subject of each memory operation, e.g., command, passed to memory device 360.

In general, memory controller block 305, responsive to receiving a signal indicating that programmable IC 300 is to be placed in suspend mode, can initiate self refresh within memory device 360. Memory controller block 305 can initiate self refresh mode within memory device 360 prior to shut down of any systems relevant to operation of memory controller block 305, e.g., those subsystems that, if shut down prior to initiation of self refresh mode within memory device 360, would result in data loss within memory device 360. By initiating self refresh within memory device 360, memory device 360 can maintain any data stored therein despite shut down, or idling, of memory controller 305. Responsive to placing memory device 360 in self refresh mode, memory controller 305 can generate a suspend acknowledgement signal. When the suspend acknowledgement signal is received by the appropriate subsystem within programmable IC 300, programmable IC 300 can be placed into suspend mode. More particularly, responsive to the suspend acknowledgement signal, various ones of the subsystems of programmable IC 300 can be powered down.

Figure 4:
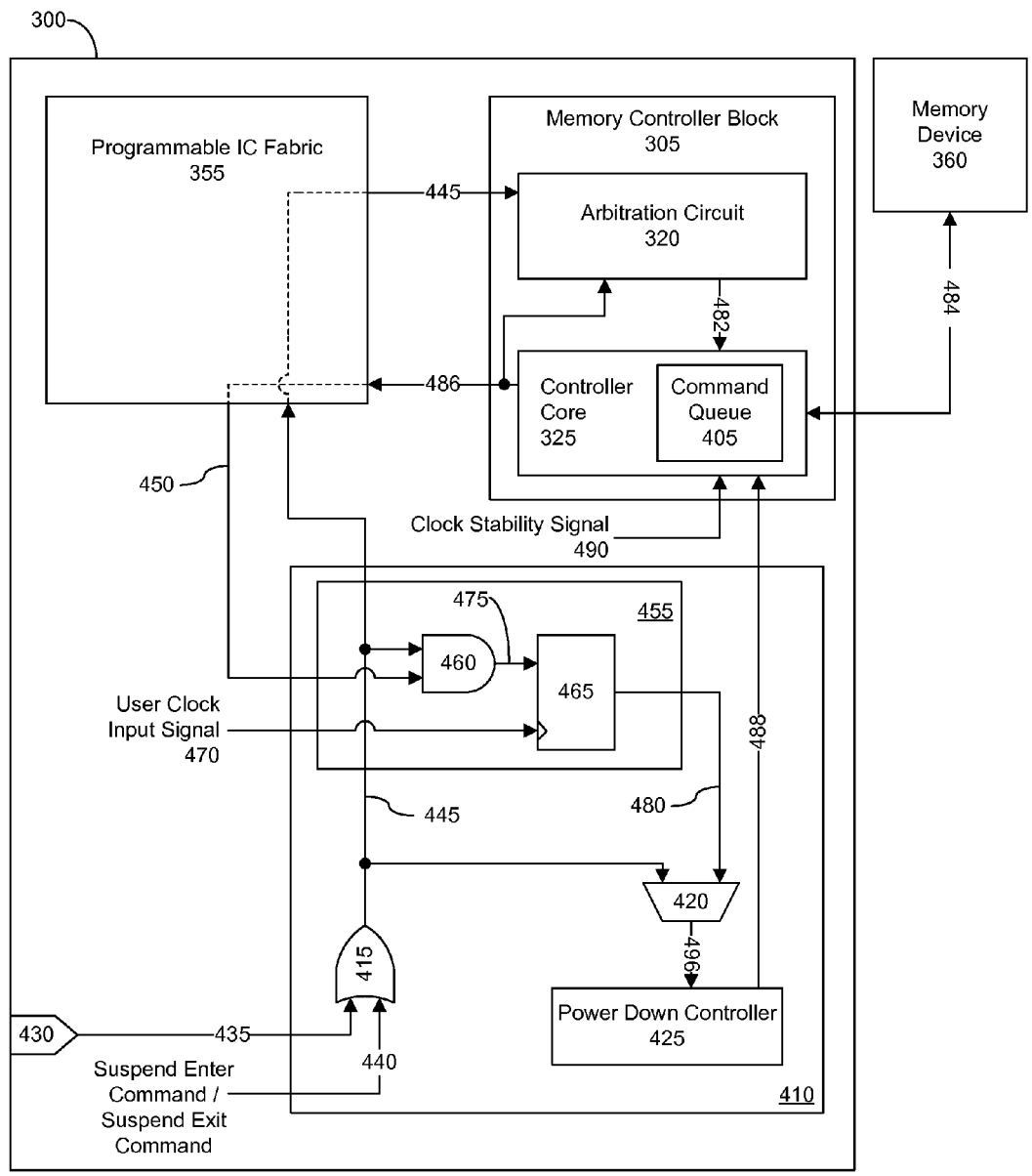
FIG. 4 is a fourth block diagram illustrating the memory controller block of FIG. 3 in accordance with another embodiment of the present invention.

FIG. 4 is a fourth block diagram illustrating memory controller block 305 of FIG. 3 in accordance with another embodiment of the present invention. FIG. 4 illustrates a simplified view of memory controller block 305 within programmable IC 300 for purposes of illustration. It should be appreciated that the various subsystems and components illustrated in FIG. 4 are not drawn to scale, but rather are pictured to facilitate a better understanding of selected aspects of one or more embodiments disclosed within this specification. FIG. 4 depicts an additional circuit block that operates in cooperation with memory controller block 305. In particular, FIG. 4 illustrates a configuration controller 410 comprising a suspend circuit block 455.

In general, configuration controller 410 is configured to regulate initiation and implementation of suspend mode within programmable IC 300. As shown, configuration controller 410 can include an OR gate 415, a multiplexer 420, and a power down controller 425. In one aspect, suspend mode can be initiated, or triggered, by asserting a suspend enter signal 435 via pin 430. Alternatively, suspend mode can be initiated by providing a suspend enter command via signal 440. When either suspend enter signal 435 is received via pin 430 or the suspend enter command is received via signal 440, OR gate 415 outputs, or asserts, a suspend request signal 445. As shown, suspend request signal 445 is coupled to programmable IC fabric 355, suspend circuit block 455, and multiplexer 420.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each signal or wire may represent bi-directional communication between two, or more, components connected by the signal or wire as the case may be.

In addition, for purposes of discussion, "asserting" a signal can mean bringing the voltage of a signal high on the signal or wire. Correspondingly, "de-asserting" a signal can mean bringing the voltage low on the signal or wire. This convention, e.g., positive logic, is used for purposes of illustration and is not intended as a limitation of the embodiments described within this specification. As such, it should be appreciated that negative logic, e.g., where a logic one is expressed by bringing voltage of a signal low and a logic zero is expressed by bringing voltage of a signal high, can be used as an alternative. Further, asserting or de-asserting a signal is not intended to preclude, and thus can also refer to, the conveyance of one or more bits, e.g., a command, via a signal or wire or the generation of a signal. Thus, asserting a signal can include sending a command and de-asserting a signal can include sending a command that countermands an earlier sent command.

Suspend request signal 445 can be distributed to, and used by, various subsystems of programmable IC 305 to trigger necessary preparations for the impending implementation of suspend mode within programmable IC 305. By providing suspend request signal 445 to programmable IC fabric 355, suspend request signal 445 can be routed to any of a variety of different subsystems including memory controller block 305. Continuation of suspend mode, i.e., actual shutdown of the various subsystems of programmable IC 305 that become inactive or powered down during suspend mode, can be performed or continued by configuration controller 410 only after receiving a suspend acknowledgement signal 450 indicating that each respective recipient of suspend request signal 445 that is configured to respond has completed preparations necessary for implementation of suspend mode.

In general, suspend circuit block 455 allows memory controller block 305 to synchronize operations with the implementation of suspend mode within programmable IC 300. Suspend circuit block 455 can include an AND gate 460 and a flip-flop 465. As pictured, suspend circuit block 455 includes a three pin interface. The three pin interface facilitates synchronization of the trigger that initiates suspend mode even in cases where multiple clock domains require synchronization. A user clock input signal 470 is coupled to a clock input of flip-flop 465. Suspend request signal 445 is coupled to a first input of AND gate 460. Suspend acknowledgement signal 450 is coupled to a second input of AND gate 460. Suspend acknowledgement signal 450 can be synchronous with user clock input signal 470.

Thus, only when both suspend request signal 445 and suspend acknowledgement signal 450 are asserted does AND gate 460 output a logic high on signal 475 to flip-flop 465. Flip-flop 465, in turn, outputs a logic high on signal 480 to configuration controller 410, i.e., to an input of multiplexer 420. Power down controller 425 can continue initiation of suspend mode when suspend request signal 445 and suspend acknowledgement signal 450 are logic highs. Power down controller effectively does not initiate shut down of any subsystem within programmable IC, or at least those that influence operation of memory controller block 305, until such time that suspend acknowledgement signal 450 is asserted. When signal 475 goes high, signal 480 can be asserted, thereby causing multiplexer 420 to assert signal 496 to power down controller 425. Assertion of signal 496 can cause power down controller 425 to issue signals causing shut down of selected subsystems within programmable IC 300.

Suspend request signal 445 can be routed through programmable IC fabric 355 to an input port (not shown) of memory controller block 305. From the input port, suspend request signal 445 is provided to an input of arbitration circuit 320. Responsive to receiving, e.g., assertion of, suspend request signal 445, arbitration circuit 320 is configured to stop fetching new commands from the command ports of memory controller block 305 illustrated in FIG. 3. When arbitration circuit 320 is in the process of fetching a new command from a command port when suspend request signal 445 is asserted, arbitration circuit 320 can be configured to complete the fetch operation that is in progress prior halting arbitration functions.

When arbitration functions have halted, arbitration circuit 320 asserts a self refresh act signal 482 to controller core 325. Assertion of self refresh act signal 482 instructs controller core 325 to prepare for issuance of a self refresh enter command to memory device 360. With self refresh act signal 482 asserted, controller core 325 continues to execute commands that are already stored within command queue 405 until command queue 405 is empty, e.g., all commands stored therein have been executed. Command queue 405 is an internal queue of controller core 325 that is configured to store commands fetched by arbitration circuit 320. In one aspect, command queue 405 can be configured as a multi-position first-in-first-out (FIFO) memory capable of storing a plurality of commands, e.g., the last four commands, fetched by arbitration circuit 320 and executable by controller core 325.

In one embodiment, responsive to executing all commands from command queue 405, controller core 325 can be configured to wait a first predetermined amount of time needed for a state machine disposed within controller core 325 to return to an idle state. It should be appreciated that the particular amount of time needed for controller core 325 to return to the idle state can vary according to the particular implementation of the state machine disposed therein. In one embodiment, however, controller core 325 can wait 15 clock cycles from the time that controller core 325 completes execution of the last command stored within command queue 405.

Responsive to the state machine of controller core 325 entering idle state, controller core 325 can issue a self refresh enter command to memory device 360 via signal 484. In one embodiment, controller core 325 can wait a second predetermined amount of time after issuance of the self refresh enter command to memory device 360. Upon expiration of the second predetermined amount of time, controller core 325 can assert an internal self refresh signal 486 that is output to programmable IC fabric 355. Internal self refresh signal 486 can be coupled to arbitration circuit 320 and suspend acknowledgement signal 450 through programmable IC fabric 355.

In one embodiment, internal self refresh signal 486 can be propagated through programmable IC fabric 355, thereby becoming suspend acknowledgement signal 450, e.g., where internal self refresh signal 486 is effectively equivalent to suspend acknowledgement signal 450. In another embodiment, suspend acknowledgement signal 450 can be a function of internal self refresh signal 486 and at least one other acknowledgement signal generated by one or more other subsystems or components within programmable IC fabric 355 or at least propagated through programmable IC fabric 355.

Waiting the second predetermined amount of time prior to asserting internal self refresh signal 486 ensures that memory device 360 has completed the transition to self refresh mode. When in self refresh mode, data stored within memory device 360 is preserved while programmable IC 300, and thus, memory controller block 305, remain in suspend mode. While in self refresh mode, memory device 360 is not dependent upon memory controller block 305 for refreshing, for example, to maintain data stored therein.

Since implementation of suspend mode within programmable IC 300 does not continue until suspend acknowledgement signal 450 is asserted, in another embodiment, the second predetermined amount of time further ensures that no subsystem of programmable IC 300 that must remain active to prevent data loss within memory device 360 is powered down prior to memory device 360 completing the transition into self refresh mode responsive to assertion of the self refresh command via signal 484. In this regard, memory device 360 can be placed into self-refresh mode, for example, prior to blocking inputs of programmable IC 300, write protecting writable clocked elements within programmable IC 300, applying a suspend constraint, e.g., gating, outputs of programmable IC 300 (which can have user-definable behavior in terms of driving the last value, being tri-stated, pulled-up, or pulled-down), and/or shutting down systems and/or elements including, but not limited to, the global clock network, IOIs, the clock manager, and the like within programmable IC 300. When internal self refresh signal 486 is asserted, arbitration circuit 320 can be configured to de-assert self refresh act signal 482, while continuing to halt arbitration operations.

When suspend acknowledgement signal 450 is asserted and propagated through suspend circuit block 455 to power down controller 425 via signals 480 and 496, configuration controller 410 continues implementation of suspend mode. Power down controller 425, for example, can assert a power down signal 488, which can be provided to various circuit blocks in programmable IC 300, including memory controller block 305 as shown. Power down signal 488 can be a dedicated signal distributed throughout programmable IC 300. In another embodiment (not shown), power down signal 488 can be routed to programmable IC fabric 355 for distribution throughout programmable IC 300.

In one aspect, power down signal 488 can be used by memory block controller 305 as a reset signal that, while asserted, holds the state machine within controller core 325 in the idle state. While power down signal 488 is asserted, controller core 325 remains in the idle state suspending all operations without resetting any of the other registers or functions of memory block controller 305.

In general, clock stability signal 490 is provided throughout programmable IC 300 to various circuit blocks to indicate when the global clocking network of programmable IC 300 is stable. Because the global clocking network is one of the subsystems that is shut down during suspend mode, clock stability signal 490 is de-asserted or lost. Ordinarily, loss of clock stability signal 490 causes memory controller block 305 to reset and also reset memory device 360, thereby clearing any contents within memory device 360. To prevent such a reset of memory controller block 305 and memory device 360, controller core 325 uses internal self refresh signal 486 to gate clock stability signal 490 while programmable IC 300 remains in suspend mode, e.g., from the time that suspend mode is initiated to the time that suspend mode is successfully exited. Thus, responsive to generating internal self refresh signal 486, controller core 325 can gate clock stability signal 490.

Programmable IC 300 begins exiting suspend mode when suspend enter signal 435, via pad 430, is de-asserted or when a suspend exit command is received via signal 440. It should be appreciated, however, that one or more other dedicated suspend exit signals can be received that are not illustrated for bringing programmable IC 300 out of suspend mode. In any case, responsive to a suspend exit condition, configuration controller 410 begins a wake-up, or suspend exit, procedure. For example, configuration controller 410 can restart the global clocking network. Configuration controller 410 further can generate global signals that are distributed to the various subsystems of programmable IC 300, including memory controller block 305, indicating that programmable IC 300 is exiting, or has exited, suspend mode. For example, signal 488 can be de-asserted, suspend request signal 445 can be de-asserted, or one or more other signals (not shown) can be asserted indicating exit from suspend mode.

In response to notification that programmable IC 300 is exiting suspend mode, memory controller block 305 can prepare to bring memory block 360 out of self refresh mode. Controller core 325 can continue to monitor for assertion of clock stability signal 490 indicating that the global clock network of programmable IC 300 is powered on and is stable. When, subsequent to notification that programmable IC 300 is exiting suspend mode, clock stability signal 490 is asserted, controller core 325 can discontinue gating clock stability signal 490. Responsive to detecting assertion of clock stability signal 490, controller core 320 can send a self refresh exit command to memory device 360 via signal 484.

Memory device 360, responsive to receiving the self refresh exit command, can perform an internal procedure to exit self refresh mode according to the controlling specification for the particular type or family of memory device to which memory device 360 belongs. In one embodiment, core controller 325 can wait a predetermined amount of time, e.g., a third predetermined amount of time, for a delay locked loop (DLL) within memory device 360 to achieve lock. The amount of time needed for the DLL to achieve lock can vary according to the particular type of memory device 360, e.g., 256 clock cycles for DDR and DDR2 and 512 clock cycles for DDR3) according to the controlling specification. Responsive to expiration of the third predetermined amount of time, controller core 325 can de-assert internal self refresh signal

486. As noted, internal self refresh signal 486 is provided both to arbitration circuit 320 and suspend circuit block 455. Accordingly, responsive to de-assertion of internal self refresh signal 486, arbitration circuit 320 can resume arbitration functions. Correspondingly, suspend acknowledgement signal 450 can be de-asserted.

Figure 5:
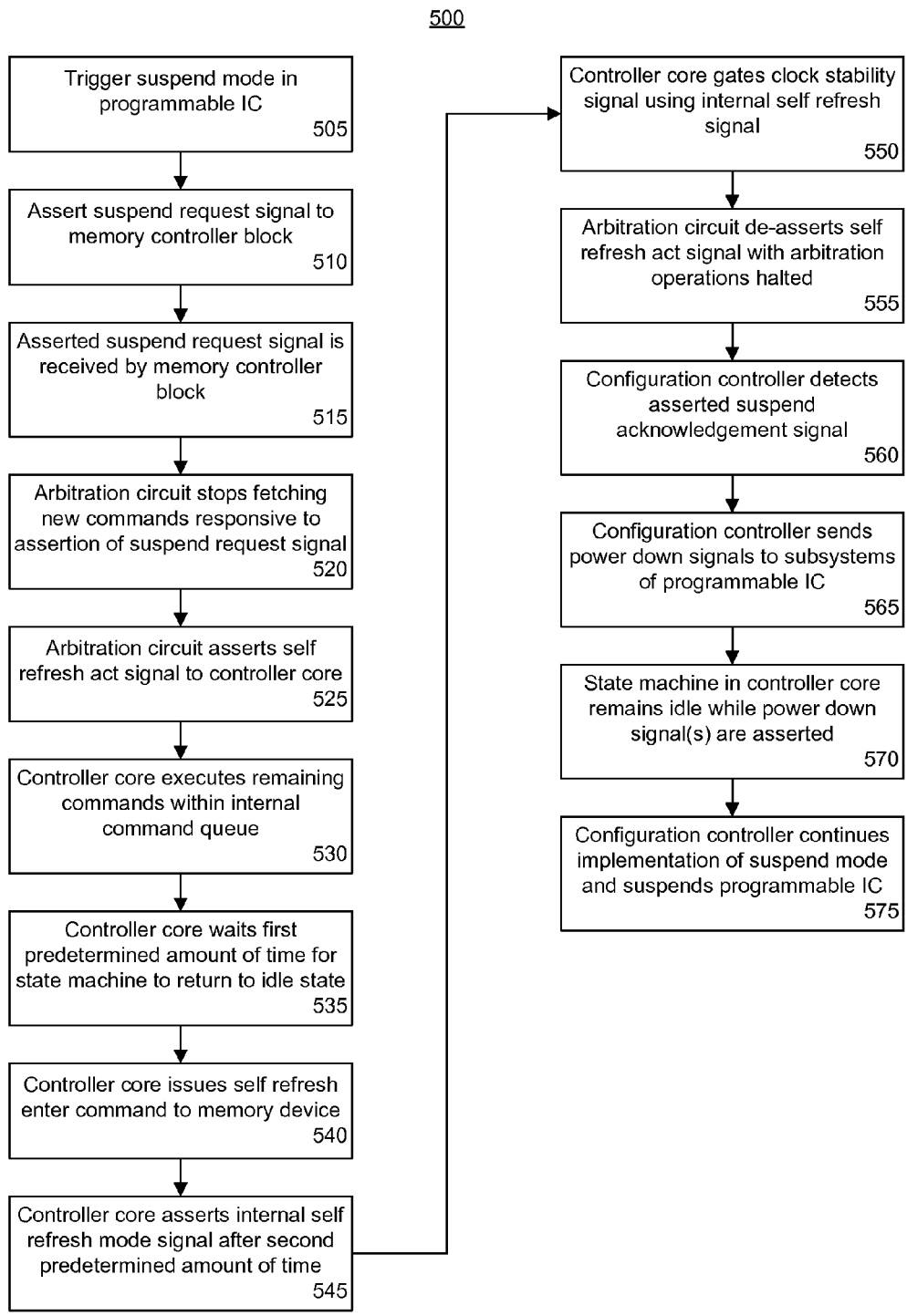
FIG. 5 is a first flow chart illustrating a method of entering suspend mode within a programmable IC in accordance with another embodiment of the present invention.

FIG. 5 is a first flow chart illustrating a method 500 of entering suspend mode in a programmable IC in accordance with another embodiment of the present invention. Method 500 can be implemented by a programmable IC comprising a memory controller as described within this specification with reference to FIGS. 1-4.

In step 505, suspend mode in the programmable IC can be triggered and, thus, detected by the configuration controller. As noted, suspend mode can be triggered via a suspend enter signal or by receipt of the suspend enter command within the configuration controller. In step 510, in response to the triggering of suspend mode, the configuration controller can assert the suspend request signal to one or more subsystems of the programmable IC, including the memory controller block.

In step 515, the asserted suspend request signal can be received by the memory controller block. More particularly, the asserted suspend request signal can be detected by the arbitration circuit within the memory controller block. In step 520, responsive to assertion of the suspend request signal, the arbitration circuit can stop fetching new commands from the command ports of the memory controller block, and thus, stop providing new commands to the controller core of the memory controller block for execution.

In step 525, the arbitration circuit can assert the self refresh act signal to the controller core. In step 530, the controller core executes any remaining commands within the command queue, e.g., those commands already fetched by the arbitration circuit, in response to the assertion of the self refresh act signal. In step 535, the controller core, also in response to the assertion of the self refresh act signal, waits a first predetermined amount of time for the state machine to return to idle state after execution of the last command from the command queue. In step 540, responsive to expiration of the first predetermined amount of time, the command queue issues a self refresh enter command to the memory device.

In step 545, the controller core asserts the internal self refresh signal responsive to expiration of a second predetermined amount of time after issuing the self refresh enter command to the memory device. In step 550, the controller core gates the clock stability signal using the internal self refresh signal. In step 555, the arbitration circuit de-asserts the self refresh act signal while arbitration operations remain halted in the arbitration circuit. In step 560, the configuration controller receives, e.g., detects assertion of, the suspend acknowledgement signal responsive to assertion of the internal self refresh signal by the controller core.

In step 565, responsive to the assertion of the suspend acknowledgement signal, the configuration controller asserts power down signal(s) to subsystems of the programmable IC. In step 570, the state machine of the controller core remains in the idle state while the power down signal(s) remain asserted. In step 575, responsive to assertion of the suspend acknowledgement signal, the configuration controller continues implementation of the suspend mode and suspends the programmable IC. As noted, responsive to assertion of the suspend acknowledgement signal, the power down controller can begin to power down various subsystems of the programmable IC.

Figure 6:
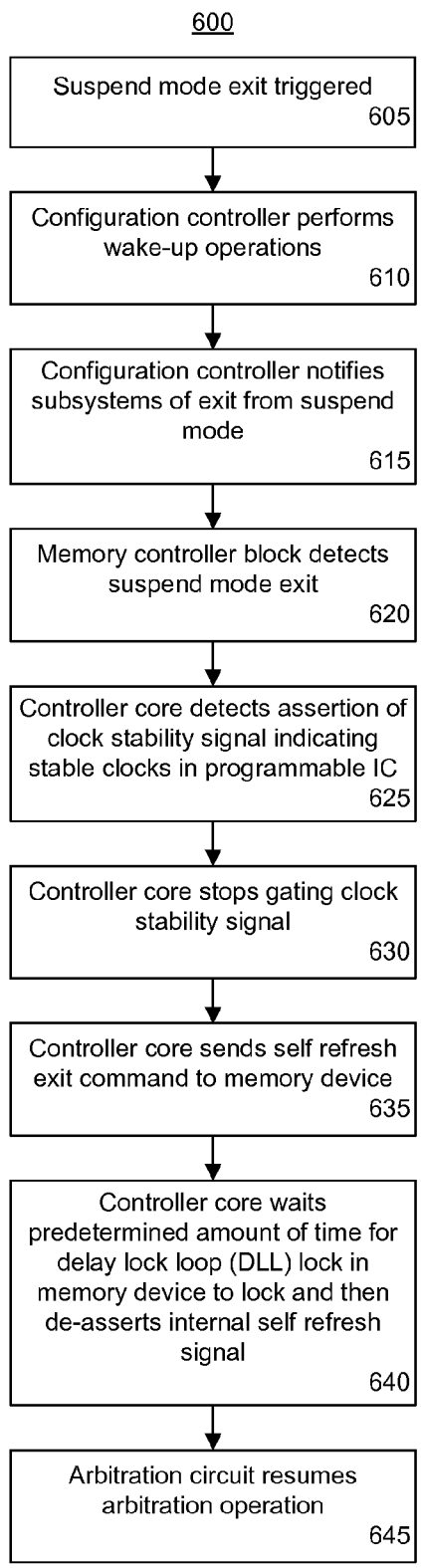
FIG. 6 is a second flow chart illustrating a method of exiting suspend mode within the programmable IC in accordance with another embodiment of the present invention.

FIG. 6 is a second flow chart illustrating a method 600 of exiting the suspend mode in the programmable IC in accordance with another embodiment of the present invention. Method 600 can be implemented by a programmable IC comprising a memory controller as described within this specification with reference to FIGS. 1-5. FIG. 6 illustrates a method that can be implemented to bring the programmable IC out of suspend mode entered as described with reference to FIG. 5.

In step 605, the configuration controller can detect the triggering of an exit from suspend mode within the programmable IC. As noted, an exit from suspend mode can be triggered by de-assertion of the suspend enter signal, receipt of a suspend exit command, or assertion of other dedicated signal(s). In step 610, the configuration controller can perform wake-up operations necessary to bring the programmable IC out from, or exit, suspend mode. Any systems that were powered down when suspend mode was entered can be powered back on. For example, the global clock networks of the programmable IC can be powered back on. Gating of any IOBs can be discontinued, etc.

In step 615, the configuration controller can notify the subsystems of the programmable IC that the programmable IC is exiting from, or has exited, suspend mode. For example, the power down signal can be de-asserted. Alternatively, or in combination, one or more other signals can be asserted indicating the programmable IC is exiting or has exited from suspend mode.

In step 620, the memory controller block can detect the exit from suspend mode. For example, the arbitration circuit can detect the de-assertion of the suspend request signal and notify the controller core. In another embodiment, one or more other signals indicating the programmable IC is exiting from, or has exited, suspend mode can be provided to the memory controller block, whether to the arbitration circuit and/or the controller core to indicate such a condition.

In step 625, the controller core detects the assertion of the clock stability signal indicating that the clocks, which can include the global clock network and the I/O clock network, within the programmable IC are now stable. In response, in step 630, the controller core discontinues gating of the clock stability signal. In step 635, responsive to detecting that the global clock network within the programmable IC is now stable, the controller core sends a self refresh exit command to the memory device. Upon receipt of the self refresh exit command, the memory device implements an exit procedure from the self refresh mode.

In step 640, the controller core waits a predetermined amount of time, e.g., the third predetermined amount of time. During the third predetermined amount of time, the DLL within the memory device achieves lock. Responsive to expiration of the third predetermined amount of time, the controller core can de-assert the internal self refresh signal. In step 645, responsive to the internal self refresh signal being de-asserted, the arbitration circuit can resume arbitration operations.

One or more embodiments disclosed within this specification provide methods, systems, and apparatus relating to entering and exiting a suspend mode within a programmable IC. The programmable IC can enter suspend mode in a coordinated fashion with a memory controller disposed within the programmable IC. By coordinating how the programmable IC enters suspend mode, preparatory measures can be implemented to ensure that the memory device controlled by the memory controller block within the programmable IC does not suffer any data loss when entering suspend mode, during suspend mode, or upon exiting suspend mode as the programmable IC returns to normal operation.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments of the present invention can be realized in hardware or a combination of hardware and software. One or more embodiments can be realized in a centralized fashion in one system or in a distributed fashion where different elements are spread across several interconnected systems. Any kind of data processing system or other apparatus adapted for carrying out the methods described herein is suited.

One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of one or more embodiments of the present invention.

What is claimed is:

1. A programmable integrated circuit device (IC), comprising:
    a configuration controller configured to assert a suspend request signal responsive to an input triggering suspend mode within the programmable IC; and
    a memory controller block coupled to the configuration controller and a memory device, wherein the memory controller block is configured to place the memory device in self refresh mode in response to the suspend request signal and assert a suspend acknowledgement signal subsequent to placing the memory device in self refresh mode,
    wherein the configuration controller continues implementing suspend mode within the programmable IC responsive to assertion of the suspend acknowledgement signal.

2. The programmable IC of claim 1, further comprising:
    programmable IC fabric configured to couple the suspend request signal to the memory controller block and configured to couple the suspend acknowledgement signal from the memory controller block to the configuration controller.

3. The programmable IC of claim 1, further comprising:
    a suspend circuit block disposed within the configuration controller, wherein the suspend circuit block is configured to assert the suspend request signal in response to the input triggering suspend mode, and wherein the suspend circuit block is further configured to assert a signal instructing the configuration controller to continue implementing suspend mode within the programmable IC responsive to the suspend acknowledgement signal;
    wherein the configuration controller does not assert a power down signal to a subsystem of the programmable IC until the signal instructing the configuration controller to continue implementing suspend mode is asserted.

4. The programmable IC of claim 1, wherein the memory controller block comprises:
    an arbitration circuit configured to schedule commands received by the memory controller block for processing; and
    a controller core coupled to the arbitration circuit, wherein the controller core is configured to execute commands scheduled by the arbitration circuit;
    wherein the arbitration circuit is further configured to stop fetching commands responsive to assertion of the suspend request signal.

5. The programmable IC of claim 4, wherein the arbitration circuit is further configured to assert a self refresh act signal to the controller core responsive to the suspend request signal.

6. The programmable IC of claim 5, wherein the controller core is further configured to send a self refresh enter command to the memory device responsive to assertion of the self refresh act signal.

7. The programmable IC of claim 6, wherein the controller core further comprises a command cache and a state machine, wherein the controller core is further configured to send the self refresh enter command to the memory device responsive to first executing any commands remaining within the command cache, and second, the state machine returning to an idle state.

8. The programmable IC of claim 6, wherein the controller core is further configured to assert an internal self refresh signal responsive to sending the self refresh enter command to the memory device and gate a clock stability signal indicating whether a global clock network of the programmable IC is stable using the internal self refresh signal.

9. The programmable IC of claim 8, wherein the controller core is further configured to wait a predetermined amount of time after sending the self refresh enter command to the memory device prior to asserting the internal self refresh signal.

10. The programmable IC of claim 8, wherein the controller core is further configured, responsive to de-assertion of the suspend request signal and the clock stability signal indicating stable clocks within the programmable IC, to issue a self refresh exit command to the memory device and discontinue gating the clock stability signal.

11. The programmable IC of claim 1, wherein:
the configuration controller and the memory controller block are within the programmable IC;
the memory device is external to the programmable integrated circuit;
the suspend acknowledgement signal is generated responsive to placing the memory device in self refresh mode; and
the configuration controller does not assert a power down signal to a subsystem of the programmable IC until a signal instructing the configuration controller to continue implementing suspend mode is asserted responsive to the suspend acknowledgement signal.

12. A memory controller block disposed within a programmable integrated circuit device (IC), wherein the memory controller block is coupled to a memory device, the memory controller block comprising:
an arbitration circuit configured to fetch commands received by the memory controller block to be executed, wherein, responsive to a suspend request signal indicating that the programmable IC is to be placed into suspend mode in which at least one subsystem of the programmable IC is powered down, the arbitration circuit is configured to stop fetching commands and generate a self refresh act signal; and
a controller core coupled to the arbitration circuit configured to execute commands fetched by the arbitration circuit, wherein the controller core, responsive to the self refresh act signal, is further configured to execute any commands already fetched prior to the suspend request signal and issue a self refresh enter command to the memory device placing the memory device in a self refresh mode, wherein the memory device is external to the programmable IC.

13. The memory controller block of claim 12, wherein the controller core is further configured to generate an internal self refresh signal responsive to issuing the self refresh enter command to the memory device and gate a clock stability signal indicating whether a global clock network of the programmable IC is stable using the internal self refresh signal.

14. The memory controller of claim 13, wherein the controller core is further configured to wait a predetermined amount of time after issuing the self refresh enter command prior to generating the internal self refresh signal.

15. The memory controller block of claim 13, wherein the controller core is further configured, responsive to determining that the programmable IC is exiting suspend mode and the clock stability signal indicates stability of the global clock network, to issue a self refresh exit command to the memory device and discontinue gating the clock stability signal.

16. The memory controller block of claim 12, wherein the controller core is further configured to generate a suspend acknowledgement signal subsequent to placing the memory device in self refresh mode, wherein the programmable IC is only placed into suspend mode and a power down signal is provided to the at least one subsystem of the programmable IC responsive to the suspend acknowledgement signal.

17. The memory controller block of claim 12, wherein the controller core further comprises a command cache and a state machine, wherein the controller core is further configured to issue the self refresh enter command to the memory device responsive to first executing any commands remaining within the command cache, and second, the state machine returning to an idle state.

18. Within a programmable integrated circuit device (IC) comprising a memory controller block coupled to a memory device, a method of placing the programmable IC in suspend mode, comprising:
responsive to an input triggering a suspend mode within the programmable IC, sending a suspend request signal to the memory controller block located within the programmable IC;
responsive to the suspend request signal, the memory controller block placing the memory device in a self refresh mode;
wherein the memory device is external to the programmable IC; and
responsive to placing the memory device in the self refresh mode, generating a suspend acknowledgement signal within the programmable IC, wherein the programmable IC is placed in suspend mode and a power down signal is provided to at least one subsystem of the programmable IC responsive to the suspend acknowledgement signal.

19. The method of claim 18, further comprising gating a clock stability signal provided to the memory controller block indicating whether a global clock network of the programmable IC is stable.

20. The method of claim 18, further comprising:
discontinuing fetching new commands within the memory controller block responsive to the suspend request signal; and
executing any commands already fetched and then allowing the memory controller block to return to an idle state prior to placing the memory device in self refresh mode.

* * * * *